(12) United States Patent
Rangaraj et al.

(10) Patent No.: US 7,692,307 B2
(45) Date of Patent: Apr. 6, 2010

(54) COMPLIANT STRUCTURE FOR AN ELECTRONIC DEVICE, METHOD OF MANUFACTURING SAME, AND SYSTEM CONTAINING SAME

(75) Inventors: Sudarshan Rangaraj, Chandler, AZ (US); Shankar Ganapathysubramanian, Phoenix, AZ (US); Richard Harries, Chandler, AZ (US); Mitul Modi, Phoenix, AZ (US); Sankara J. Subramanian, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 508 days.

(21) Appl. No.: 11/636,250

(22) Filed: Dec. 8, 2006

(65) Prior Publication Data

US 2008/0137318 A1   Jun. 12, 2008

(51) Int. Cl.
*H01L 23/48* (2006.01)

(52) U.S. Cl. .................................... 257/774; 438/612
(58) Field of Classification Search .................... 257/24
See application file for complete search history.

(56) References Cited

U.S. PATENT DOCUMENTS

| 6,528,215 | B1 * | 3/2003 | Lercel | 430/5 |
| 2001/0023533 | A1 * | 9/2001 | Sylvester | 29/830 |
| 2006/0027934 | A1 * | 2/2006 | Edelstein et al. | 257/774 |

* cited by examiner

*Primary Examiner*—Thao P. Le
(74) *Attorney, Agent, or Firm*—Kenneth A. Nelson

(57) ABSTRACT

A compliant structure for an electronic device comprises a substrate (110) composed of a first material (111) and a compliant zone (120) within the substrate. A plurality of solder joints (280) are located between, and form a connection between, the substrate and the electronic device (290). The compliant zone reduces the degree of deformation experienced by the solder joints due to thermal mismatch loading between the substrate and the die during attachment of the die to the substrate (chip attach). This reduction in solder joint deformation reduces the likelihood that the solder joints will crack.

12 Claims, 4 Drawing Sheets

COMPLIANT STRUCTURE FOR AN ELECTRONIC DEVICE, METHOD OF MANUFACTURING SAME, AND SYSTEM CONTAINING SAME

FIELD OF THE INVENTION

The disclosed embodiments of the invention relate generally to chip attach mechanisms, and relate more particularly to the reduction of solder joint cracking following chip attach.

BACKGROUND OF THE INVENTION

Computer chips are often connected to an underlying substrate using a series of solder balls, solder bumps, or other solder joints or the like (often called first level interconnect solder bumps) that are positioned between the chip and the substrate and then heated to the point where the solder reflows. During chip attach there is a significant thermal expansion mismatch between the substrate and the chip (also referred to herein as a die) because of the large difference in their coefficients of thermal expansion (CTE). A typical organic substrate has a CTE that is perhaps five or six times greater than the CTE of a silicon die. Accordingly, when the die is placed on the substrate and heated to the solder reflow temperature, the expansion experienced by the substrate is considerably larger than that experienced by the die. As a result of this mismatch in thermal expansion rates the die is very often warped, bent, or otherwise deformed when the die and the substrate are later cooled to room temperature and the solder has solidified. The thermal expansion mismatch also causes significant shear stresses in the first level interconnect solder bumps as well as stresses in the die interconnect layers. These stresses are increased when the substrates are relatively thick, relatively stiff (e.g., have a relatively high elastic modulus), or have locally high copper densities near the solder bumps. All of these stresses can cause cracking of the solder bumps following chip attach.

Relaxation of substrate design rules, such as a change from solder mask defined pads to metal defined pads, have been used in an attempt to overcome the solder bump cracking problem. Such changes, however, are often accompanied by a deterioration in electrical performance. Other attempts to alleviate solder bump cracking include the local modification of substrate copper densities and substrate solder resist openings. These, however, are point solutions that cannot always be deployed. Major processing changes designed to circumvent the problem are in many cases similarly impractical. Accordingly, there exists a need for a structure capable of reducing stresses and strains in solder interconnect materials, and in the dies and substrates with which they are associated, that is not burdened with the foregoing and other shortcomings of existing attempted solutions.

BRIEF DESCRIPTION OF THE DRAWINGS

The disclosed embodiments will be better understood from a reading of the following detailed description, taken in conjunction with the accompanying figures in the drawings in which.

Figure 1:
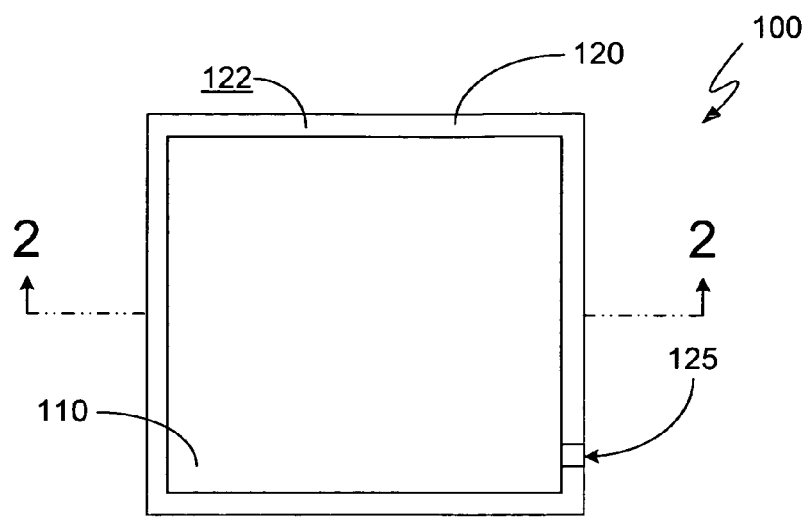
FIG. 1 is a plan view of a compliant structure for an electronic device according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used.

DETAILED DESCRIPTION OF THE DRAWINGS

In one embodiment of the invention, a compliant structure for an electronic device comprises a substrate composed of a first material and further comprises a compliant zone within the substrate. A plurality of solder joints are located between, and form a connection between, the substrate and the electronic device. The compliant zone reduces the degree of deformation experienced by the solder joints due to thermal mismatch loading between the substrate and the die during attachment of the die to the substrate (chip attach). This reduction in solder joint deformation reduces the likelihood that the solder joints will crack.

Referring now to the figures, FIG. 1 is a plan view of a compliant structure 100 for an electronic device 290 (omitted from FIG. 1 for clarity; see FIG. 2) according to an embodiment of the invention. As an example, compliant structure 100 can be a semiconducting structure. As illustrated in FIG. 1, compliant structure 100 comprises a substrate 110 composed of a material 111, and further comprises a compliant zone 120 within substrate 110. Compliant zone 120 contains a material 122. In the illustrated embodiment compliant zone 120 extends around the perimeter of substrate 110. A portion 125 of compliant zone 120 will serve as a representative element for all of compliant zone 120, and will be examined in greater detail in connection with a subsequent figure.

In one embodiment, material 111 is a conglomeration of several individual materials that make up a typical substrate for an electronic device. Such materials may include copper or other electrically conducting materials, dielectric materials, materials typically used to form vias and plated through holes (PTHs), and the like. Accordingly, in one embodiment a CTE of material 111 may be an overall or average CTE of all the materials that make up material 111, and a stiffness of material 111 may be an overall or average stiffness of all such materials.

In the same or another embodiment, material 122 is an underfill material having a stiffness of, for example, approximately 3 mega-Pascals (3 MPa). In a different embodiment, material 122 is the dielectric material used elsewhere in substrate 110 but without the other materials that make up a typical substrate, including those mentioned above. Typically, such dielectric material is a low stiffness polymer. In this disclosure, a low stiffness polymer is a polymer having a stiffness approximately equal to or less than the overall or average stiffness of substrate 110. In a particular embodiment, a low stiffness polymer is a polymer having a stiffness of no greater than approximately 150 megapascals (MPa). As will be discussed in more detail below, lowering the stiffness of material 122 with respect to material 111 reduces stress and/or plastic strain experienced by the solder joints, the electronic device, and/or other components of the system of which substrate 110 is a part, thereby lessening the likelihood of damage to such system and its components.

Figure 2:
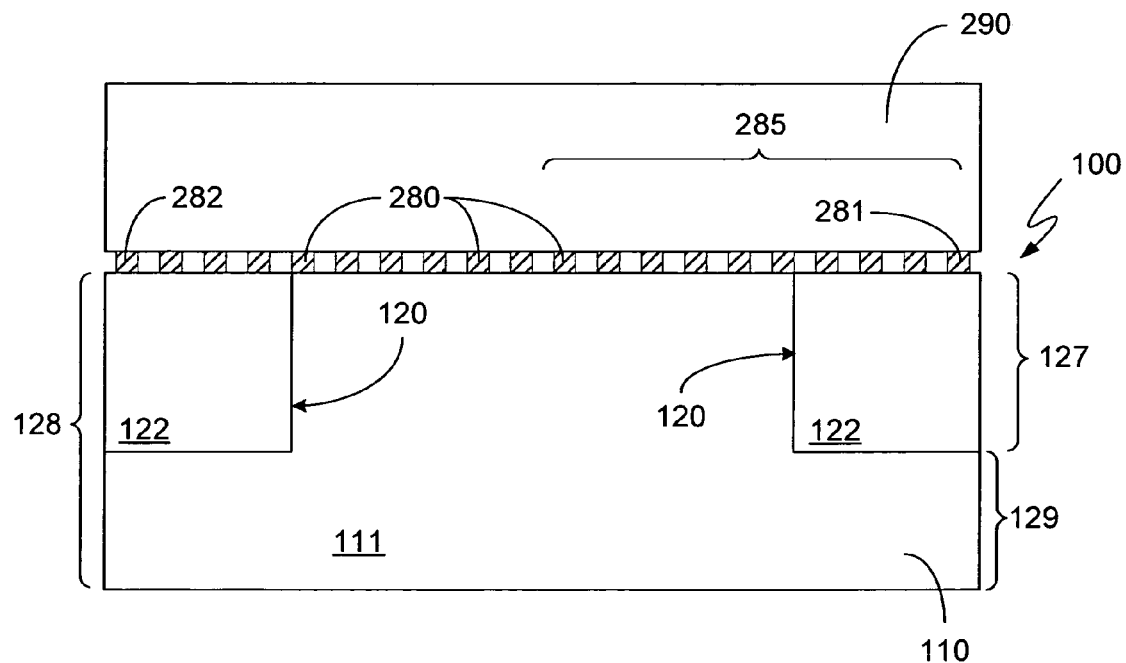
FIG. 2 is a cross-sectional view of the compliant structure of FIG. 1 according to an embodiment of the invention.

FIG. 2 is a cross-sectional view of compliant structure 100 according to an embodiment of the invention. The cross section of FIG. 2 is taken along a line 2-2 in FIG. 1. (The cross section of FIG. 2 may include, but does not necessarily include, one or more portions that are similar to portion 125.) As illustrated in FIG. 2, electronic device 290 is connected to substrate 110 by solder bumps or solder joints 280. As an example, electronic device 290 can be a computer chip or die.

As was mentioned above, solder joints 280 are exposed to significant stresses as a result of the thermal expansion mismatch between substrate 110 and electronic device 290. Such stresses tend to cause cracking and other deformation of solder joints 280, and also tend to cause warping and other deformation of electronic device 290. These stresses become increasingly severe at larger distances away from the center of electronic device 290 because, while electronic device 290 typically experiences little or no deformation at its center (which for that reason is often called its neutral point), it typically experiences its greatest deformation at or near the largest distance from the neutral point (or "largest DNP").

In general terms, stress is equal to stiffness multiplied by displacement, which suggests that the stress experienced by a material may be reduced by reducing one or both of: (a) the material's stiffness; and (b) the amount by which it is displaced. In at least one embodiment of the invention, stress is reduced not by reducing the stiffness of the solder material itself, but by reducing the stiffness of an adjacent material, thereby lessening the displacement or deformation experienced by the solder bumps.

In the illustrated embodiment, a solder joint 281 (which is one of solder joints 280) is located at a distance 285 from the neutral point of electronic device 290. (A solder joint 282, another one of solder joints 280, is on an opposite side of electronic device 290, and is located at a distance from the neutral point equal or approximately equal to distance 285. It should be understood that what is said herein of solder joint 281 also applies to solder joint 282, as well as to other solder joints not specifically referenced herein, provided appropriate adjustments are made to account for the difference in position relative to the neutral point.) A distance from the neutral point to each one of solder joints 280 is less than or equal to distance 285, such that distance 285 represents the largest DNP for electronic device 290. As shown, at least a portion of compliant zone 120 is located at the largest distance from the neutral point and underlies at least solder joint 281. Compliant zone 120 may also underlie additional ones of solder joints 280 adjacent to solder joint 281, as needed or desired for particular chip design requirements. In that regard, it may be said that in general, larger chips tend to experience greater stress, and may in some instances (though not necessarily all instances) require larger compliant zones in order to compensate for that greater stress.

In one embodiment, material 111 has a first stiffness and material 122 has a second stiffness that is less than the first stiffness. In other words, compliant zone 120 contains a material having a stiffness that is less than the stiffness of the rest of substrate 110. The lower stiffness of material 122 compared to the stiffness of material 111 results in a lowered stress level for compliant zone 120.

As known in the art, plastic strain is a manifestation of the deformation caused by stress on an object. As mentioned above, by reducing the amount of stress to which compliant zone 120 is exposed, the strain to which solder joints 280 are subjected, and the deformation which they experience, may likewise be reduced, and solder joints 280 may therefore be made less likely to crack or otherwise fail. Reductions in plastic strain of greater than a factor of three have been demonstrated using techniques and structures according to embodiments of the invention.

Material 111 has a first CTE and material 122 has a second CTE. Electronic device 290 has a third CTE. In one embodiment, the second CTE is approximately equal to the first CTE. In other words, in one embodiment compliant zone 120 contains a material having a CTE that is approximately equal to the CTE of substrate 110. (Such a match in local CTE values may help overcome such issues as internal delamination, among other possible advantages.) In another embodiment, the second CTE is less than the first CTE, such that compliant zone 120 contains a material having a CTE that is less than the CTE of substrate 110. In that latter embodiment, or in a different embodiment, the second CTE is approximately equal to the third CTE, meaning that compliant zone 120 contains a material having a CTE that is approximately equal to the CTE of electronic device 290.

As an example, material 111 can be an organic material (i.e., substrate 110 can be an organic substrate) and material 122 can be a low CTE polymer, which in this disclosure means a polymer having a CTE approximately equal to or less than the overall or average CTE of substrate 110. In one embodiment, the low CTE polymer is a polymer having a CTE of no greater than approximately 20 parts per million (ppm) per degree Celsius.

In the embodiment illustrated in FIG. 2, compliant zone 120 extends into substrate 110 to a depth 127. In a particular example, depth 127 may be at least approximately 0.5 millimeters. Depth 127, as illustrated, is less than a height 128 of substrate 110, leaving a region 129 of substrate 110 under compliant zone 120 through which wiring traces (not shown) may be routed. As will be understood by those of ordinary skill in the art, routing such wiring traces, which are frequently made of copper, through instead of underneath compliant zone 120 would likely increase the stiffness in compliant zone 120, an effect contrary to that desired.

Figure 3:
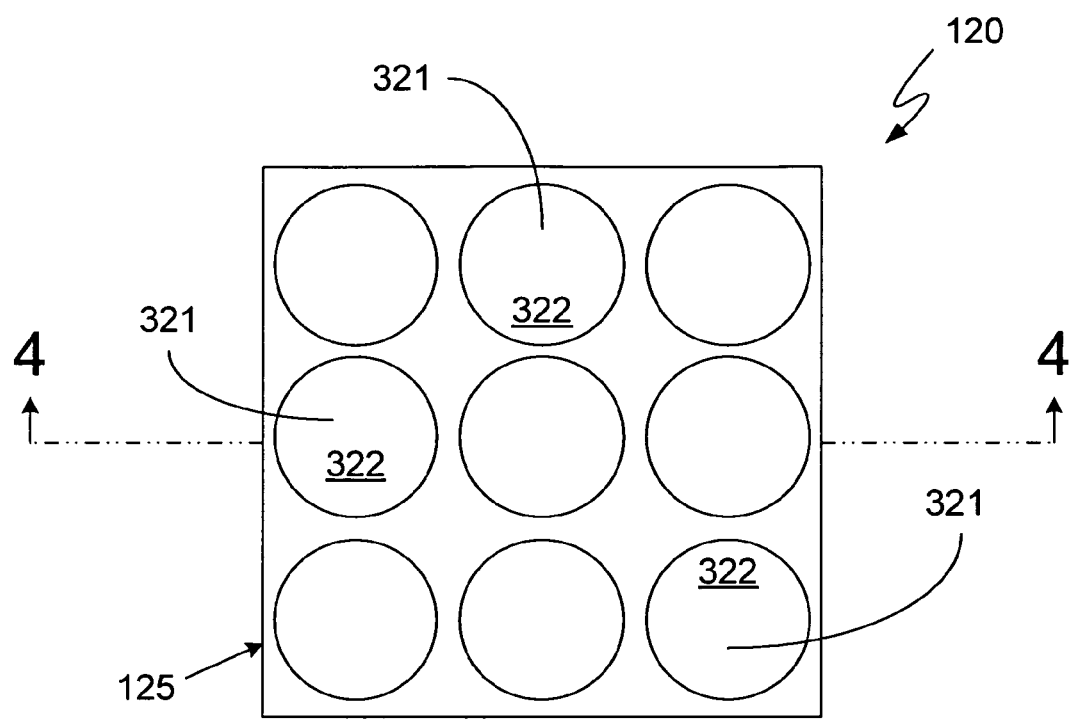
FIG. 3 is a plan view of a portion of a compliant zone according to an embodiment of the invention.
Figure 4:
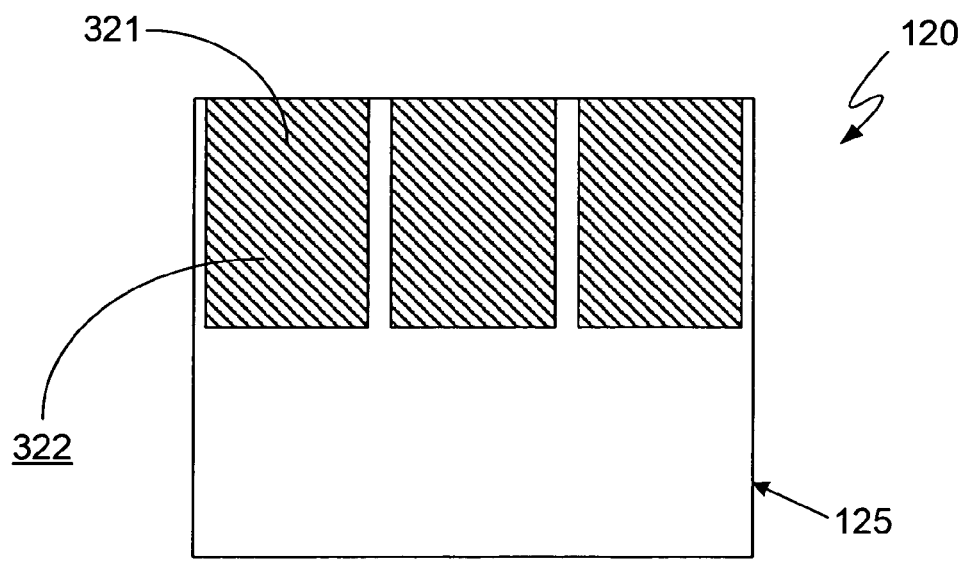
FIG. 4 is a cross-sectional view of the portion of the compliant zone shown in FIG. 3 according to an embodiment of the invention.

FIG. 3 is a plan view and FIG. 4 is a cross-sectional view (taken along line 4-4 of FIG. 3) of portion 125 of compliant zone 120 according to an embodiment of the invention. It should be understood that portion 125 of compliant zone 120 is intended to be illustrative of compliant zone 120 as a whole, and that any other comparable portion of compliant zone 120 may be (but need not necessarily be) similar to portion 125.

In the illustrated embodiment, portion 125 comprises a plurality of cavities 321, each of which may contain a material 322. As an example, cavities 321 may be circular or substantially circular, as depicted in FIGS. 3 and 4. Alternatively, cavities 321 may be square or substantially square, or they may have some other shape. Whatever their shape, cavities 321 may in at least one embodiment be formed using a drilling operation such as is often used to form vias in integrated circuits. Because such vias are typically circular, making cavities 321 circular as well may offer certain benefits in terms of efficiency, reduced cost, or the like.

As another example, portion 125, instead of having nine cavities 321 as in the illustrated embodiment, may have more or fewer than nine cavities. In a particular embodiment portion 125 may contain only a single cavity 321. In one manifestation of that particular embodiment, cavity 321 occupies all or substantially all of portion 125. In a different manifestation of that particular embodiment, single cavity 321 may occupy less than substantially all of portion 125. As yet another example, portion 125 may contain cavities 321 in a geometric arrangement other than the illustrated geometric arrangement, such that, for example, cavities 321 are randomly rather than uniformly distributed. As still another example, cavities 321 may extend all or substantially all of the way to the bottom of portion 125, as opposed to the embodiment illustrated in FIG. 4 in which cavities 321 extend only partway into portion 125.

As an example, material 322 can be similar to material 122, first shown in FIG. 1, such that material 322 is a low stiffness polymer. As another example, portion 125 may contain a first low stiffness polymer and cavities 321 may be drilled into the first low stiffness polymer and may contain a second low stiffness polymer. In one embodiment the second low stiffness polymer has a stiffness that is less than the stiffness of the first low stiffness polymer, so as to reduce the stiffness of portion 125 even beyond the reduction achieved when just the first low stiffness polymer is used.

Figure 5:
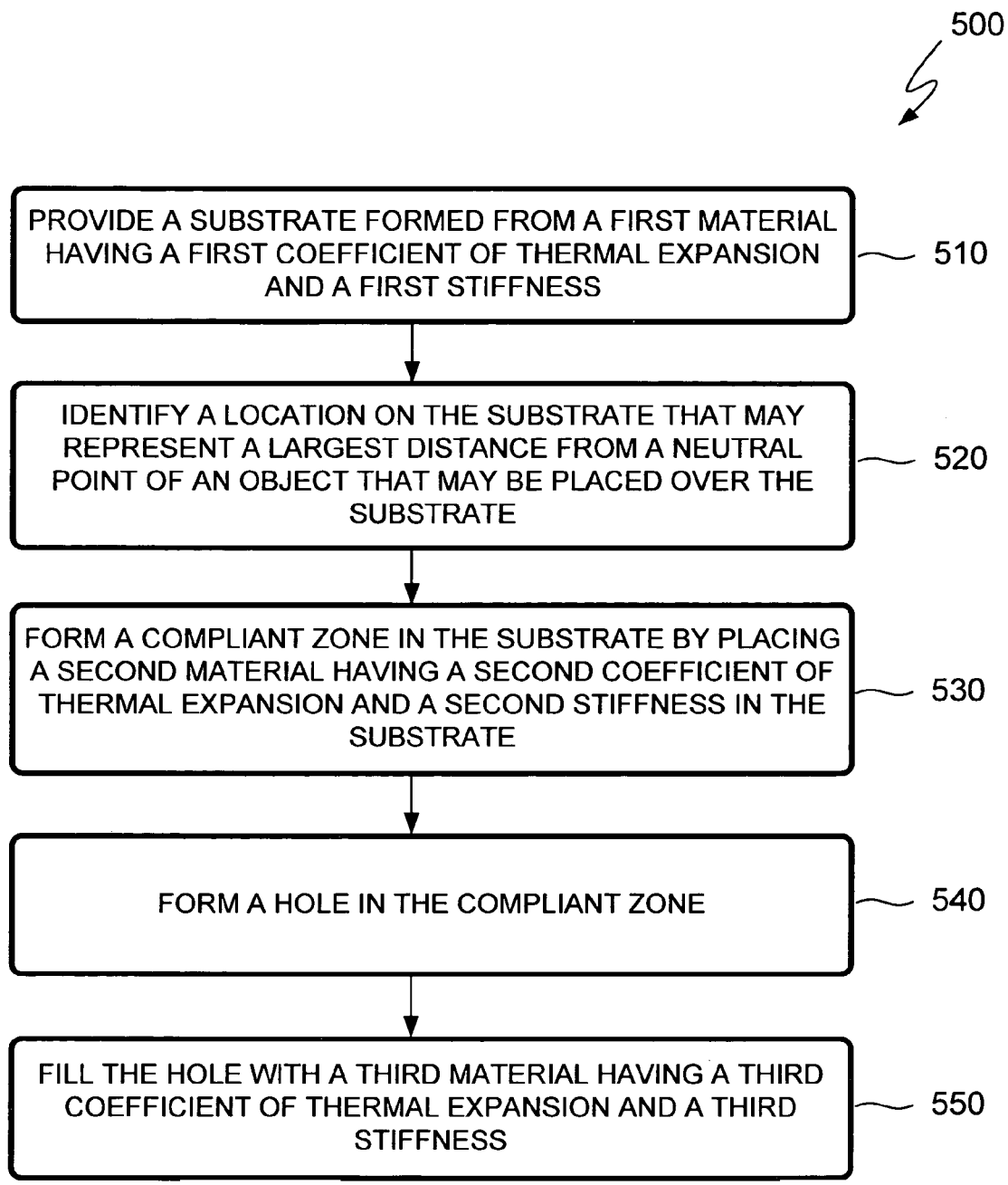
FIG. 5 is a flowchart illustrating a method of manufacturing a compliant structure for an electronic device according to an embodiment of the invention.

FIG. 5 is a flowchart illustrating a method 500 of manufacturing a compliant structure for an electronic device according to an embodiment of the invention. A step 510 of method 500 is to provide a substrate formed from a first material having a first coefficient of thermal expansion and a first stiffness. As an example, the substrate and the first material can be similar to, respectively, substrate 110 and material 111, both of which were first shown in FIG. 1.

In one embodiment, step 510 comprises providing a plurality of electrically conducting layers and a plurality of electrically insulating layers. In the same or another embodiment, step 510 further comprises forming a stack in which the electrically conducting layers alternate with the electrically insulating layers, and treating the stack such that the electrically conducting layers and the electrically insulating layers are laminated together.

A step 520 of method 500 is to identify a location on the substrate that may represent a largest distance from a neutral point of an object that may be placed over the substrate. As an example, the object that may be placed over the substrate can be similar to electronic device 290, shown in FIG. 2. As another example, the neutral point may be at or near a center of the electronic device or other object, as explained above, and the largest distance from the neutral point can be similar to distance 285, depicted in FIG. 2.

A step 530 of method 500 is to form a compliant zone in the substrate by placing a second material having a second coefficient of thermal expansion and a second stiffness in the substrate. As an example, the compliant zone can be similar to compliant zone 120, first shown in FIG. 1. As another example, the second material can be similar to material 122, also first shown in FIG. 1. In one embodiment, step 530 comprises forming the compliant zone at the location on the substrate that was identified in step 520. In the same or another embodiment, step 530 comprises filling an area in which the compliant zone is to be formed with the same dielectric material used elsewhere in the substrate by laying dielectric upon dielectric as in a typical substrate formation process, but without placing in that area any other material or structures, including copper, PTHs, vias, or the like.

A step 540 of method 500 is to form a hole in the compliant zone. As an example, the hole can be similar to one of cavities 321, first shown in FIG. 3. As another example, step 540 can comprise drilling the hole in the substrate, as was mentioned above. More generally, step 540 or another step can comprise drilling a hole in each layer as such layers are added in the current substrate manufacturing process, in much the same way, for example, as PTHs are formed.

In one embodiment, step 540 comprises forming an opening in the stack after the electrically conducting layers and the electrically insulating layers are laminated together, whether that lamination occurs in step 510 or in another step. In a different embodiment, step 540 comprises forming one or more holes in one or more of the electrically conducting layers, including at least a first hole in a first one of the electrically conducting layers, and further comprises forming one or more holes in one or more of the electrically insulating layers, including at least a second hole in a first one of the electrically insulating layers. Then, in the same or another embodiment, step 540, step 510, or another step comprises forming a stack in which the electrically conducting layers alternate with the electrically insulating layers and in which the first hole and the second hole are aligned with each other. Step 540, step 510, or another step then further comprises treating the stack such that the electrically conducting layers and the electrically insulating layers are laminated together and such that the first hole and the second hole together form a hole that extends through both the first one of the electrically conducting layers and the first one of the electrically insulating layers.

A step 550 of method 500 is to fill the hole with a third material having a third coefficient of thermal expansion and a third stiffness. As an example, the third material can be similar to material 322, first shown in FIG. 3. Accordingly, the third material can have a stiffness that is less than the stiffness of the first material and, perhaps, less than the stiffness of the second material, as more fully discussed above. Furthermore, the third material can have a coefficient of thermal expansion that is approximately equal to or that is less than the coefficient of thermal expansion of the first material and/or of the second material, as was also discussed in more detail above.

Figure 6:
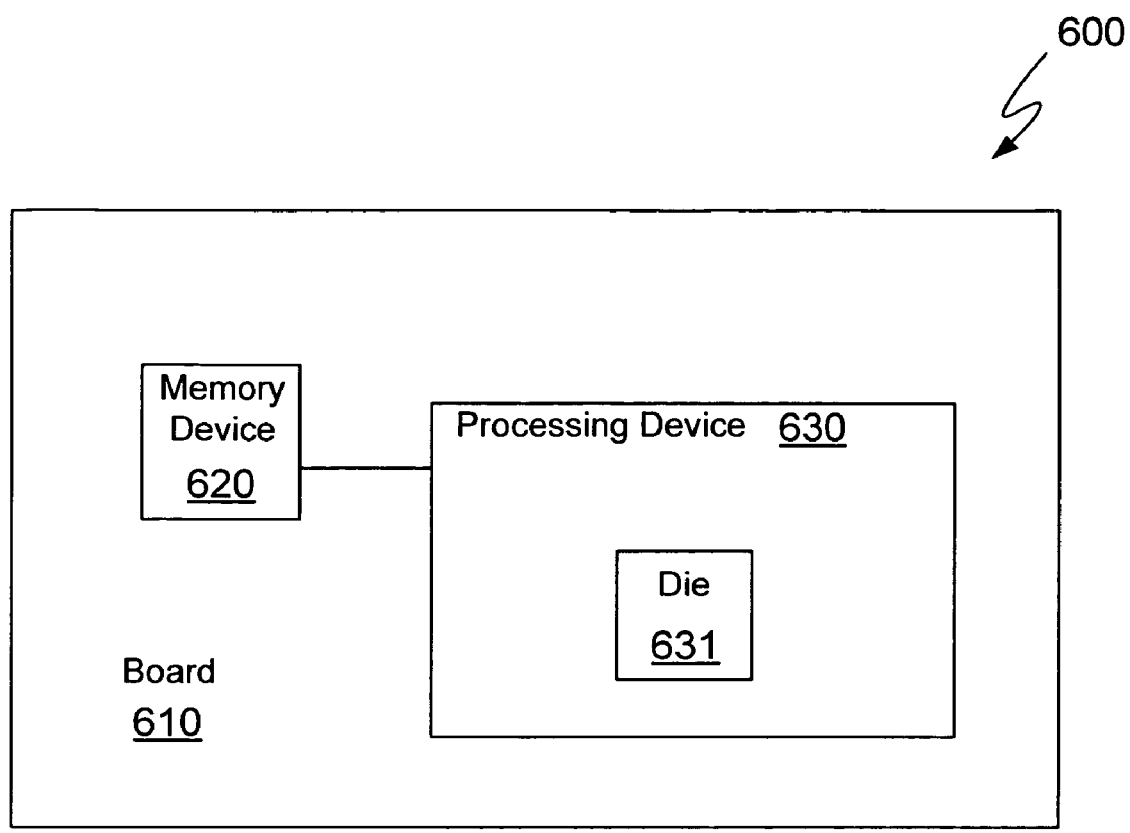
FIG. 6 is a schematic representation of a system including a compliant structure for an electronic device according to an embodiment of the invention.

FIG. 6 is a schematic representation of a system 600 that includes a compliant structure for an electronic device according to an embodiment of the invention. As illustrated in FIG. 6, system 600 comprises a board 610, a memory device 620 disposed on board 610, and a processing device 630 disposed on board 610 and coupled to memory device 620. Processing device 630 comprises a die 631 and further comprises a substrate (not shown in FIG. 6) composed of a first material. In one embodiment die 631 is coupled to the substrate via a plurality of solder joints (also not shown in FIG. 6). The substrate contains a compliant zone containing a second material. In one embodiment the compliant zone comprises one or more cavities that may be filled with a third material. Like the substrate and the solder joints, the compliant zone and the one or more cavities are not shown in FIG. 6, but examples are shown in previous figures and discussed above.

As an example, die 631 can be similar to electronic device 290, shown in FIG. 2. As another example, the substrate, the first material, the solder joints, the compliant zone, the cavities, the second material, and the third material can be similar to, respectively, substrate 110, material 111, solder joints 280, compliant zone 120, cavities 321, material 122, and material 322, all of which were shown in at least one of FIGS. 1-3.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the compliant structure and associated methods and systems discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A compliant structure for an electronic device, the compliant structure comprising:
   a substrate composed of a first material; and
   a die coupled to the substrate via a plurality of solder joints, wherein:
   the die comprises a neutral point;
   the substrate comprises a compliant zone that contains a second material;
   a first solder joint of the plurality of solder joints is located at a first distance from the neutral point;
   a distance from the neutral point to each one of the solder joints in the plurality of solder joints is less than or equal to the first distance, such that the first distance is a largest distance from the neutral point;
   at least a portion of the compliant zone is located at the largest distance from the neutral point; and
   the compliant zone forms a ring that extends completely around a perimeter of the substrate but does not extend vertically all the way through the substrate.

2. The compliant structure of claim 1 wherein:
   the compliant zone comprises a first cavity in the second material; and
   the first cavity contains a third material.

3. The compliant structure of claim 2 wherein:
   the compliant zone comprises a plurality of cavities, including the first cavity.

4. The compliant structure of claim 2 wherein:
   at least one of the second material and the third material is a low stiffness polymer.

5. The compliant structure of claim 4 wherein:
   the first material has a first coefficient of thermal expansion and a first stiffness;
   the low stiffness polymer has a second coefficient of thermal expansion and a second stiffness;
   the second coefficient of thermal expansion is approximately equal to the first coefficient of thermal expansion; and
   the second stiffness is less than the first stiffness.

6. The compliant structure of claim 4 wherein:
   the first material has a first coefficient of thermal expansion and a first stiffness;
   the low stiffness polymer has a second coefficient of thermal expansion and a second stiffness;
   the second coefficient of thermal expansion is less than the first coefficient of thermal expansion; and
   the second stiffness is less than the first stiffness.

7. The compliant structure of claim 6 wherein:
   the die has a third coefficient of thermal expansion; and
   the second coefficient of thermal expansion is approximately equal to the third coefficient of thermal expansion.

8. A method of manufacturing a compliant structure for an electronic device, the method comprising:
   providing a substrate formed from a first material having a first coefficient of thermal expansion and a first stiffness; and
   forming a compliant zone in the substrate by placing a second material having a second coefficient of thermal expansion and a second stiffness in the compliant zone, wherein the compliant zone forms a ring that extends completely around a perimeter of the substrate but does not extend vertically all the way through the substrate.

9. The method of claim 8 further comprising:
   forming a hole in the compliant zone; and
   filling the hole with a third material having a third coefficient of thermal expansion and a third stiffness.

10. The method of claim 9 wherein:
    forming the hole in the compliant zone comprises drilling the hole in the compliant zone.

11. The method of claim 9 further comprising:
    identifying a location on the substrate that may represent a largest distance from a neutral point of an object that may be placed over the substrate; and forming the compliant zone comprises forming at least a portion of the compliant zone at the location on the substrate.

12. The method of claim 9 wherein:

providing the substrate comprises providing a plurality of electrically conducting layers and a plurality of electrically insulating layers;

providing the substrate further comprises:

forming a stack in which the electrically conducting layers alternate with the electrically insulating layers; and treating the stack such that the electrically conducting layers and the electrically insulating layers are laminated together; and forming the hole in the compliant zone comprises:

forming an opening in the stack after the electrically conducting layers and the electrically insulating layers are laminated together.

* * * * *